(12) United States Patent
Yoon et al.

(10) Patent No.: US 12,308,270 B2
(45) Date of Patent: May 20, 2025

(54) INTER-FLOOR TRANSPORT APPARATUS AND LOGISTICS TRANSPORT SYSTEM INCLUDING THE SAME

(71) Applicant: SEMES CO., LTD., Chungcheongnam-do (KR)

(72) Inventors: Eun Sang Yoon, Gyeonggi-do (KR); Seung Keun Jun, Gyeonggi-do (KR); Hyi Jae Kang, Seoul (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 18/080,743

(22) Filed: Dec. 14, 2022

(65) Prior Publication Data
US 2023/0207363 A1  Jun. 29, 2023

(30) Foreign Application Priority Data

Dec. 29, 2021 (KR) .......................... 10-2021-0190635

(51) Int. Cl.
*H01L 21/677* (2006.01)
(52) U.S. Cl.
CPC .............................. *H01L 21/67727* (2013.01)
(58) Field of Classification Search
CPC ................................................. H01L 21/67727
See application file for complete search history.

(56) References Cited

U.S. PATENT DOCUMENTS

2007/0128007 A1* 6/2007 Bonora ............. H01L 21/67775
414/217
2021/0300693 A1* 9/2021 Lee .................... H01L 21/67742
(Continued)

FOREIGN PATENT DOCUMENTS

KR  10-2016-0016495  2/2016
KR  10-2017-0026074  3/2017
(Continued)

OTHER PUBLICATIONS

Office Action dated Jul. 7, 2023 for Korean Patent Application No. 10-2021-0190635 and its English translation by Google Translate.

*Primary Examiner* — Saul Rodriguez
*Assistant Examiner* — Brendan P Tighe
(74) *Attorney, Agent, or Firm* — WOMBLE BOND DICKINSON (US) LLP

(57) ABSTRACT

An inter-floor transport apparatus and a logistics transport system including the inter-floor transport apparatus are provided. The logistics transport system includes: a stage module installed in space where semiconductor devices are fabricated, the stage module including a plurality of stages, which are installed on different floors; a frame module installed to have a direction intersecting the plurality of stages as a length direction; and an inter-floor transport apparatus moving along the frame module and transporting conveyed articles to each of the stages, wherein the inter-floor transport apparatus includes a first load unit, which transports the conveyed articles, a second load unit, which is disposed below the first load unit and transports the conveyed articles, a driving unit, which moves the first and second load units, and a control unit, which controls an operation of the driving unit, and transports a plurality of conveyed articles at the same time.

19 Claims, 7 Drawing Sheets

(56) References Cited

U.S. PATENT DOCUMENTS

2022/0134575 A1\* 5/2022 Yoon .................. B25J 9/0087
                                                    414/277
2024/0071797 A1\* 2/2024 Li ..................... H01L 21/67727

FOREIGN PATENT DOCUMENTS

| KR | 10-2018-0126828 |   | 11/2018 |
|----|----------------|---|---------|
| KR | 20180126828 A  | \* | 11/2018 |
| KR | 10-2019-0125181 |   | 11/2019 |
| KR | 20190125181 A  | \* | 11/2019 |
| KR | 10-2021-0121589 |   | 10/2021 |
| KR | 10-2021-0157054 |   | 12/2021 |
| KR | 20210157054 A  | \* | 12/2021 |

\* cited by examiner

INTER-FLOOR TRANSPORT APPARATUS AND LOGISTICS TRANSPORT SYSTEM INCLUDING THE SAME

CROSS-REFERENCE TO RELATED APPLICATION

This application claims priority from Korean Patent Application No. 10-2021-0190635 filed on Dec. 29, 2021 in the Korean Intellectual Property Office, and all the benefits accruing therefrom under 35 U.S.C. 119, the contents of which in its entirety are herein incorporated by reference.

BACKGROUND

1. Field

The present disclosure relates to an inter-floor transport apparatus and a logistics transport system including the inter-floor transport apparatus, and more particularly, to an inter-floor transport apparatus installed in a semiconductor manufacturing plant and a logistics transport system including the inter-floor transport apparatus.

2. Description of the Related Art

Processes for manufacturing a semiconductor device may be divided into preprocesses for forming a circuit pattern on a wafer to complete a chip and postprocesses for evaluating the performance of a product obtained by the preprocesses and may be continuously performed in semiconductor manufacturing equipment.

The semiconductor manufacturing equipment may be installed in a semiconductor manufacturing plant (e.g., a clean room) or a Fab to fabricate semiconductor devices. A tower lifter may transport conveyed articles such as front opening unified pods (FOUPs) between the floors within in the semiconductor manufacturing plant.

The tower lifter generally transports a single conveyed article at a time. If there are too many conveyed articles to transport, it takes a considerable amount of time for the tower lifter to transport the conveyed articles to their destination. In this case, the overall processes of fabricating a semiconductor device may be delayed, and as a result, productivity may be lowered.

SUMMARY

Aspects of the present disclosure provide an inter-floor transport apparatus capable of transporting multiple conveyed articles between floors and a logistics transport system including the inter-floor transport apparatus.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a logistics transport system includes: a stage module installed in space where semiconductor devices are fabricated, the stage module including a plurality of stages, which are installed on different floors; a frame module installed to have a direction intersecting the plurality of stages as a length direction; and an inter-floor transport apparatus moving along the frame module and transporting conveyed articles to each of the stages, wherein the inter-floor transport apparatus includes a first load unit, which transports the conveyed articles, a second load unit, which is disposed below the first load unit and transports the conveyed articles, a driving unit, which moves the first and second load units, and a control unit, which controls an operation of the driving unit, and transports a plurality of conveyed articles at the same time.

According to another aspect of the present disclosure, a logistics transport system includes: a stage module installed in space where semiconductor devices are fabricated, the stage module including a plurality of stages, which are installed on different floors; a frame module installed to have a direction intersecting the plurality of stages as a length direction; and an inter-floor transport apparatus moving along the frame module and transporting conveyed articles to each of the stages, wherein the stage module is installed on each of the floors and includes stages, which include rails at their tops, transport units, which are installed on first sides of the stages near the frame module and transport the conveyed articles from the inter-floor transport apparatus onto the stages, and storage units, which are installed on second sides of the stages opposite to the first sides of the stages and store conveyed articles moving along the rails, the inter-floor transport apparatus includes a first load unit, which transports the conveyed articles, a second load unit, which is disposed below the first load unit and transports the conveyed articles, a driving unit, which moves the first and second load units, and a control unit, which controls an operation of the driving unit, and transports a plurality of conveyed articles at the same time, the first load unit transports conveyed articles of a first type, the second load unit transports conveyed articles of multiple types including the first type, and a moving speed of the inter-floor transport apparatus is variable depending on a size or weight of a conveyed article loaded in the second load unit.

According to another aspect of the present disclosure, an inter-floor transport apparatus for transporting conveyed articles between floors in space where semiconductor devices are fabricated, includes: a first load unit transporting the conveyed articles; a second load unit disposed below the first load unit and transporting the conveyed articles; a driving unit moving the first and second transport units; and a control unit controlling an operation of the driving unit, wherein the inter-floor transport apparatus transports a plurality of conveyed articles at the same time.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
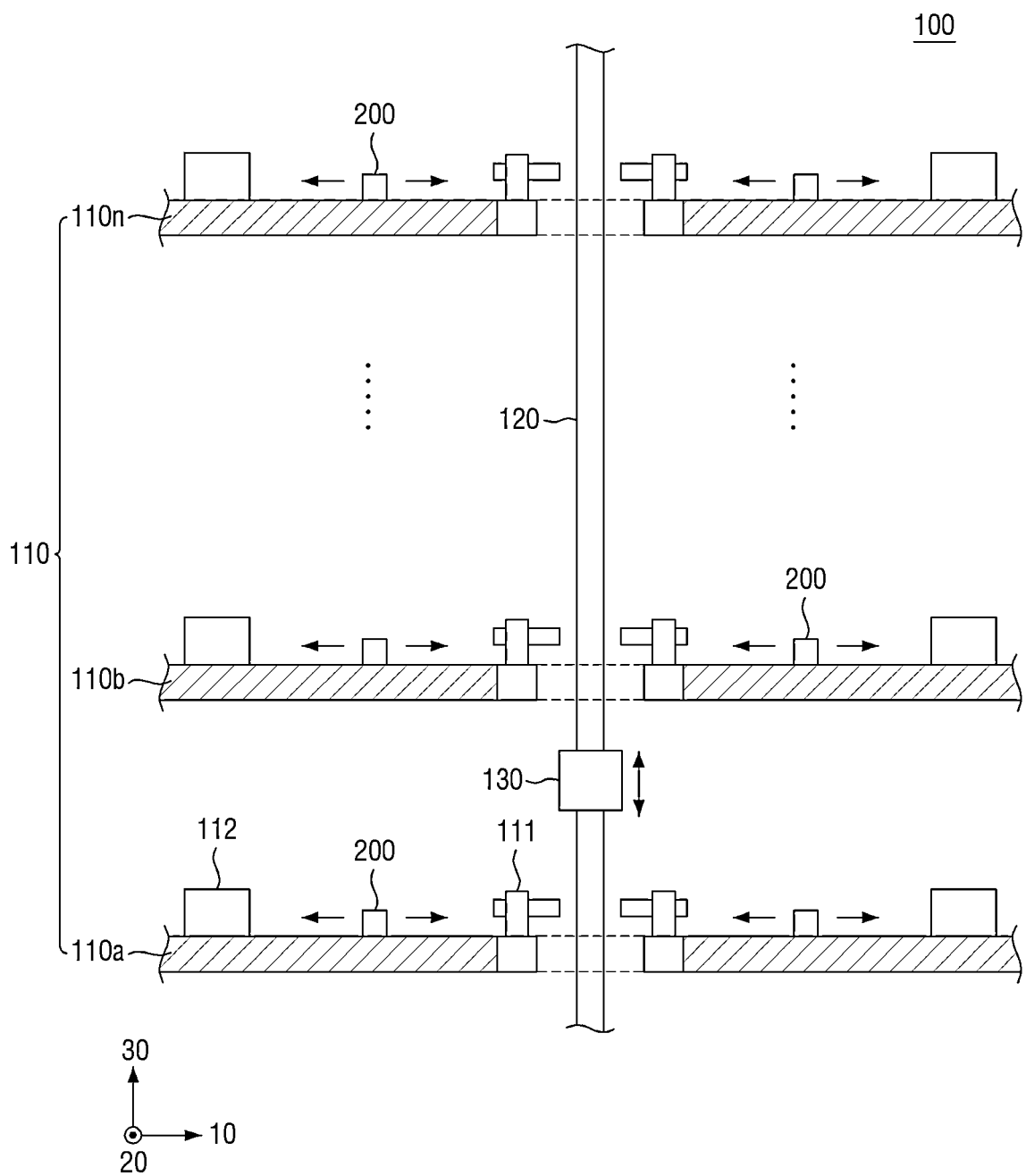
FIG. 1 is a schematic diagram of a logistics transport system according to an embodiment of the present disclosure.

Embodiments of the present disclosure will hereinafter be described with reference to the attached drawings. Like reference numerals indicate like elements throughout the present disclosure, and thus, redundant descriptions thereof will be omitted.

The present disclosure relates to an inter-floor transport apparatus capable of transporting multiple conveyed articles between floors and a logistics transport system including the inter-floor transport apparatus. The present disclosure will hereinafter be described with reference to the accompanying drawings.

FIG. 1 is a schematic diagram of a logistics transport system according to an embodiment of the present disclosure. Referring to FIG. 1, a logistics transport system 100 may be configured to include a stage module 110, a frame module 120, and an inter-floor transport apparatus 130.

The logistics transport system 100 is a facility for transporting conveyed articles 200 within a semiconductor manufacturing plant where semiconductor manufacturing equipment is installed. The logistics transport system 100 may include the inter-floor transport apparatus 130 for transporting the conveyed articles 200 between floors and may be implemented as a system equipped with, for example, a tower lifter.

The conveyed articles 200 may be articles to be transported or containers including the articles therein. The articles may be, for example, wafers, glass substrates, or reticles. The containers may be, for example, front opening unified pods (FOUPs), pods, and magazines and trays for accommodating multiple printed circuit boards (PCBs).

The logistics transport system 100 may have a multi-floor structure. The logistics transport system 100 may include n floors (where n is a natural number of 2 or greater), as illustrated in FIG. 1. The logistics transport system 100 may be configured to have an appropriate number of floors depending on the manufacturing environment in the semiconductor manufacturing plant.

In a case where the logistics transport system 100 has a multi-floor structure, the stage module 110 may be provided on each of the floors of the logistics transport system 100. For example, if the logistics transport system 100 has first through n-th floors, the stage module 110 may include first through n-th stages 110a through 110n, which are installed on the first through n-th floors, respectively.

The first through n-th stages 110a through 110n may be arranged along a vertical direction (or a third direction 30) in the semiconductor manufacturing plant. For example, the second stage 110b may be installed on a higher floor than the first stage 110a, the third stage 110c may be installed on a higher floor than the second stage 110b, and the n-th stage 110n may be installed on a higher floor than the (n−1)-th stage 110n−1. The first through n-th stages 110a through 110n may be installed to have a horizontal direction (or a first direction 10) as their length direction.

When the conveyed articles 200 are loaded, the stage module 110 may guide the conveyed articles 200 to their destinations. Although not specifically illustrated in FIG. 1, a rail may be installed along the length direction (or the first direction 10) above the stage module 110, and a moving unit, which is movable along the rail, may also be installed. Also, transport units 111 may be installed on sides of the stage module 110 adjacent to the frame module 120, and storage units 112 may be installed on other sides of the stage module 110. Here, the transport units 111 may refer to units for transporting the conveyed articles 200 from the inter-floor transport apparatus 130 onto the stage module 110, and the storage units 112 may refer to units for storing the conveyed articles 200, moved along the rails.

The frame module 120 is provided to guide the moving path of the inter-floor apparatus 130. The frame module 120 may have a profile structure and may intersect the stage module 110, which is provided on each of the floors of the logistics transport system 100.

At least one frame module 120 may be disposed in the logistics transport system 100 along a height direction (or the third direction 30). Although not specifically illustrated in FIG. 1, the frame module 120 may guide the moving path of the inter-floor transport apparatus 130 via a rail installed on a surface thereof.

The inter-floor transport apparatus 130 transports the conveyed articles 200 between the floors. The inter-floor transport apparatus 130 may be provided in the semiconductor manufacturing plant as a tower lifter robot for transporting FOUPs or pods and may transport the conveyed articles 200 to the stage module 110, which is provided on each of the floors of the logistics transport system 100.

The inter-floor transport apparatus 130 may include a load unit and may thus load and transport the conveyed articles 200, but the present disclosure is not limited thereto. The inter-floor transport apparatus 130 may include a gripping unit or a fork unit and may thus grip and transport the conveyed articles 200. The inter-floor transport apparatus 130 may transport the conveyed articles 200 between the floors in various other manners.

The inter-floor transport apparatus 130 may be movable between the floors, on the frame module 120, in a contact manner. For example, the inter-floor transport apparatus 130 may be movable between the floors by using a timing belt or a pulley structure, but the present disclosure is not limited thereto. The inter-floor transport apparatus 130 may be movable in a non-contact structure between the floors, on the frame module 120. For example, the inter-floor transport apparatus 130 may be movable on the frame module 120 in a magnetic levitation method using a linear motor coil and a linear motor magnet.

At least one inter-floor transport apparatuses 130 may be disposed on the frame module 120. The number of inter-floor transport apparatuses 130 disposed on the frame module 120 may vary depending on the number of conveyed articles to be handled in the logistics transport system 100.

In a case where multiple inter-floor transport apparatuses 130 are disposed on the frame module 120, the multiple inter-floor transport apparatuses 130 may operate independently on the frame module 120 and may move in parallel. Each of the multiple inter-floor transport apparatuses 130 may operate with, for example, a linear motor and a pinion gear.

The inter-floor transport apparatus 130 may perform interactions, such as power transmission and communication, in a non-contact state and may be movable along the frame module 120 under the conditions of low vibration and low noise. The inter-floor transport apparatus 130 can optimize the conveyance environment for the conveyed articles 200 and can contribute to the production of high-quality products.

The inter-floor transport apparatus 130 may transport a plurality of conveyed articles 200 at a time. The inter-floor transport apparatus 130 may transport, for example, two conveyed articles 200 at a time. The inter-floor transport apparatus 130 will hereinafter be described as being able to transport two conveyed articles 200 at a time, but the present disclosure is not limited thereto. The number of conveyed articles 200 that can be transported at a time by the inter-floor transport apparatus 130 may vary depending on the total number of conveyed articles 200 that need to be transported in the semiconductor manufacturing plant, and may be appropriately set, even after installation.

To transport multiple conveyed articles 200 at a time, the inter-floor transport apparatus 130 may include a plurality of load units. Alternatively, the inter-floor transport apparatus 130 may include a plurality of gripping units or fork units. The inter-floor transport apparatus 130 will hereinafter be described as including a plurality of load units to transport multiple conveyed articles 200 at a time.

Figure 2:
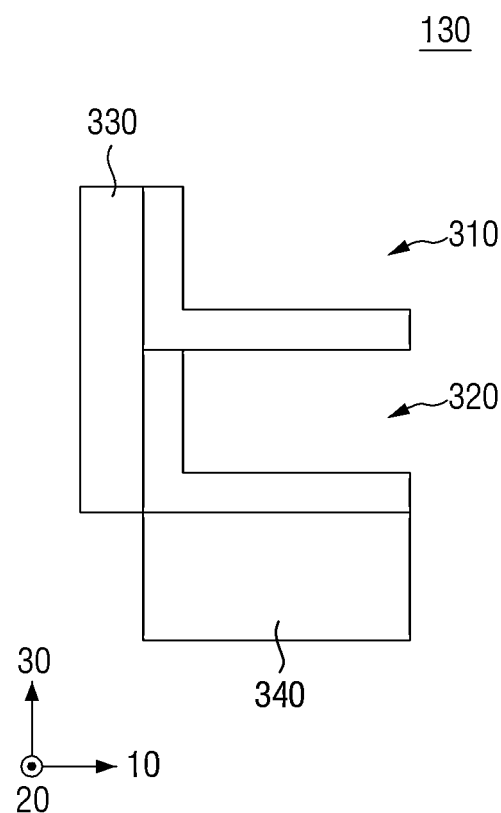
FIG. 2 is a diagram illustrating a first exemplary internal structure of an inter-floor transport apparatus of the logistics transport system.

FIG. 2 is a diagram illustrating a first exemplary internal structure of the inter-floor transport apparatus 130 of the logistics transport system 100. Referring to FIG. 2, the inter-floor transport apparatus 130 may include a first load unit 310, a second load unit 320, a driving unit 330, and a control unit 340.

Figure 3:
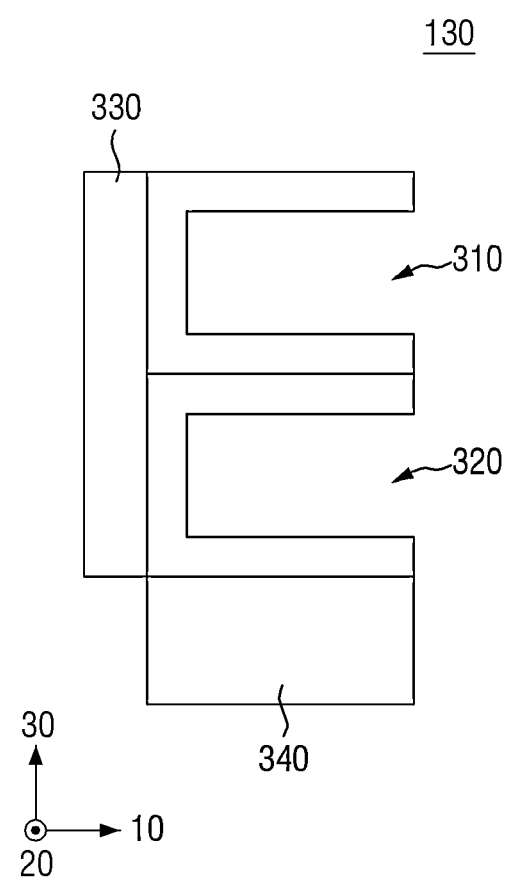
FIG. 3 is a diagram illustrating a second exemplary internal structure of the inter-floor transport apparatus of the logistics transport system.

The first load unit 310 is provided to load a conveyed article 200 therein. The first load unit 310 may be disposed above the second load unit 320 and may have at least one seating surface, on which a conveyed article 200 can be seated. The first load unit 310 may be formed as an L-shaped structure with no top cover, as illustrated in FIG. 2, but the present disclosure is not limited thereto. Alternatively, the first load unit 310 may be formed as an angled U shape with a top cover, as illustrated in FIG. 3. FIG. 3 is a diagram illustrating a second exemplary internal structure of the inter-floor transport apparatus 130 of the logistics transport system 100.

The second load unit 320, like the first load unit 310, is provided to load a conveyed article 200 therein. The second load unit 320 may be disposed below the first load unit 310 and may have at least one seating surface, on which a conveyed article 200 can be seated. The second load unit 320 may be formed as an L-shaped structure with no top cover, as illustrated in FIG. 2, but the present disclosure is not limited thereto. Alternatively, the second load unit 320 may be formed as an angled U shape with a top cover, as illustrated in FIG. 3.

The first and second load units 310 and 320 may be disposed side-by-side not in a vertical direction (or the third direction 30), but in a horizontal direction (or the first direction 10).

Referring again to FIG. 2, the first and second load units 310 and 320 may have the same shape. For example, the first and second load units 310 and 320 may both be formed as structures with no top covers or with top covers, but the present disclosure is not limited thereto. Alternatively, the first and second load units 310 and 320 may have different shapes. For example, the first and second load units 310 and 320 may be formed as a structure with no top cover and a structure with a top cover, respectively, or vice versa.

In a case where the first load unit 310 is disposed above the second load unit 320 and the first and second load units 310 and 320 have different shapes, the first load unit 310 may be formed with a top cover, and the second load unit 320 may be formed without a top cover. In this case, as the first load unit 310 can serve as a top cover for the second load unit 320, the size of the inter-floor transport apparatus 130 can be reduced, and the conveyed articles 200 loaded in the first and second load units 310 and 320 can be prevented from being damaged by any falling object.

The first and second load units 310 and 320 may transport different types of conveyed articles 200. For example, the first load unit 310 may transport articles of a first type (e.g., FOUPs) or a second type (e.g., pods), and the second load unit 310 may transport articles of a third type (e.g., magazines) or a fourth type (e.g., trays). However, the present disclosure is not limited to this example. Alternatively, the first and second load units 310 and 320 may transport the same type of conveyed articles 200.

In a case where the first and second load units 310 and 320 transport different types of conveyed articles 200, one of the first and second load units 310 and 320 may transport conveyed articles 200 of a particular type, and the other load unit may transport articles of a particular type, and the other load unit may transport articles of a variety of types including the particular type. For example, the first load unit 310 may transport conveyed articles 200 of the first type, and the second load unit 320 may transport conveyed articles 200 of the first, second, third, and fourth types. However, the present disclosure is not limited to this example. Alternatively, one of the first and second load units 310 and 320 may transport conveyed articles 200 of the particular type, and the other load unit may transport conveyed articles of various types other than the particular type. For example, the first load unit 310 may transport conveyed articles 200 of the first type, and the second load unit 320 may transport conveyed articles 200 of the second, third, and fourth types.

The first and second load units 310 and 320 may transport conveyed articles 200 of different sizes or volumes. For example, the first load unit 310 may transport a conveyed article 200 having a relatively small size or volume, and the second load unit 320 may transport a conveyed article 200 having a relatively large size or volume. However, the present disclosure is not limited to this example. Alternatively, the first and second load units 310 and 320 may transport conveyed articles 200 of the same size or the same volume.

As already mentioned above, each of the first and second load units 310 and 320 may have a seating surface, on which a conveyed article 200 can be seated. In a case where the first and second load units 310 and 320 transport conveyed articles 200 of different sizes or volumes, the first and second load units 310 and 320 may have different inner heights.

Figure 4:
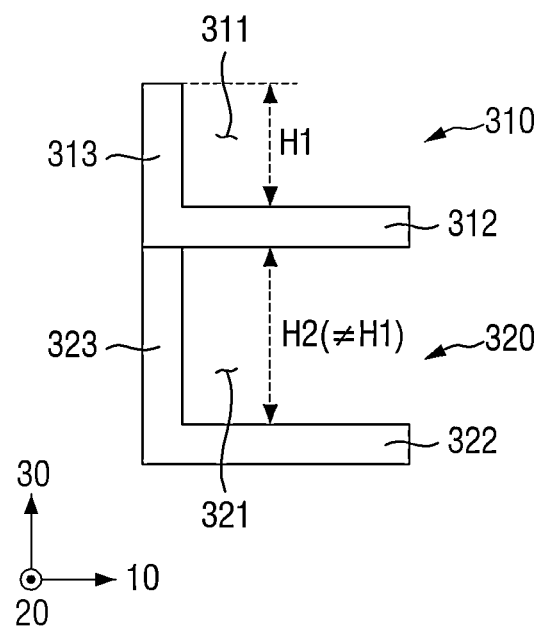
FIG. 4 is a diagram illustrating first examples of first and second load units of FIG. 2.

For example, referring to FIG. 4, in a case where the first and second load units 310 and 320 are formed as structures with no top covers, a height H1 of inner space 311 of the first load unit 310 may differ from a height H2 of inner space 321 of the second load unit 320 (i.e., H1≠H2). Specifically, the height H1 of the inner space 311 of the first load unit 310 may be less than the height H2 of the inner space 321 of the second load unit 320 (i.e., H1<H2). Alternatively, the height H1 of the inner space 311 of the first load unit 310 may be greater than the height H2 of the inner space 321 of the second load unit 320 (i.e., H1>H2).

In a case where the first load unit 310 is formed as a structure with no top cover, the first load unit 310 may include a first portion 312, which provides a seating surface for a conveyed article 200, and a second portion 313, which is provided as a sidewall. In this case, the height H1 of the inner space 311 of the first load unit 310 may be defined as the distance from the top surface of the first portion 312 to the top of the second portion 313.

Similarly, in a case where the second load unit 320 is formed as a structure with no top cover, the second load unit 320 may include a first portion 322, which provides a seating surface for a conveyed article 200, and a second portion 323, which is provided as a sidewall. In this case, the height H2 of the inner space 321 of the second load unit 320 may be defined as the distance from the top surface of the first portion 322 to the top of the second portion 323. FIG. 4 illustrates first examples of the first and second load units 310 and 320.

However, the present disclosure is not limited to this. Even in a case where the first and second load units 310 and 320 transport conveyed articles 200 of different sizes or volumes, the first and second load units 310 and 320 may have the same inner height.

Figure 5:
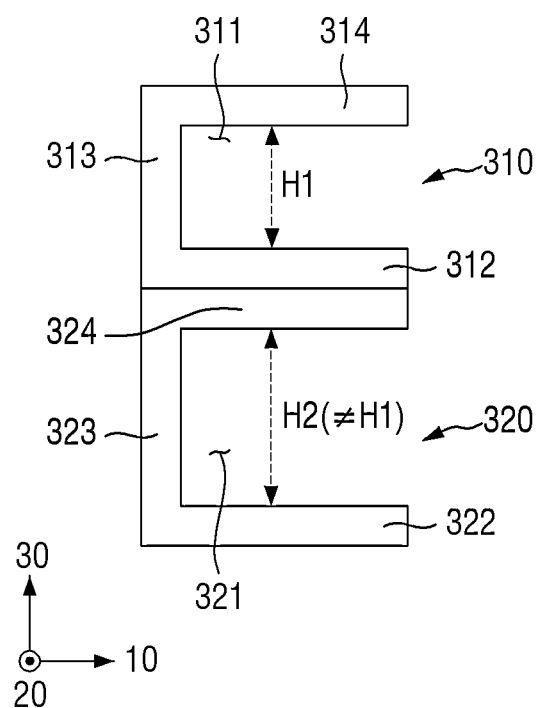
FIG. 5 is a diagram illustrating second examples of the first and second load units of FIG. 2.

For example, referring to FIG. 5, even in a case where the first and second load units 310 and 320 are formed as structures with top covers, the height H1 of the inner space 311 of the first load unit 310 may differ from the height H2 of the inner space 321 of the second load unit 320 (i.e., H1≠H2). Specifically, the height H1 of the inner space 311 of the first load unit 310 may be less than the height H2 of the inner space 321 of the second load unit 320 (i.e., H1<H2). Alternatively, the height H1 of the inner space 311 of the first load unit 310 may be greater than the height H2 of the inner space 321 of the second load unit 320 (i.e., H1>H2).

In a case where the first load unit 310 is formed as a structure with a top cover, the first load unit 310 may include a first portion 312, which provides a seating surface for a conveyed article 200, a third portion 314, which is vertically opposite to the first portion 312, and a second portion 313, which is provided as a sidewall and is connected to the first and third portions 312 and 314. In this case, the height H1 of the inner space 311 of the first load unit 310 may be defined as the distance from the top surface of the first portion 312 to the bottom surface of the third portion 314.

Similarly, in a case where the second load unit 320 is formed as a structure with a top cover, the second load unit 320 may include a first portion 322, which provides a seating surface for a conveyed article 200, a third portion 324, which is vertically opposite to the first portion 322, and a second portion 323, which is provided as a sidewall and is connected to the first and third portions 322 and 324. In this case, the height H2 of the inner space 321 of the second load unit 320 may be defined as the distance from the top surface of the first portion 322 to the bottom surface of the third portion 324. FIG. 5 illustrates secondary examples of the first and second load units 310 and 320.

The height H1 of the inner space 311 of the first load unit 310 and the height H2 of the inner space 321 of the second load unit 320 may be variable. Specifically, the height H1 of the inner space 311 of the first load unit 310 and the height H2 of the inner space 321 of the second load unit 320 may be variable depending on the size of conveyed articles 200 loaded in the first and second load units 310 and 320.

The first and second load units 310 and 320 may transport conveyed articles 200 with different frequencies of use. For example, one of the first and second load units 310 and 320 may transport a conveyed article 200 with a high frequency of use, and the other load unit may transport a conveyed article 200 with a low frequency of use. However, the present disclosure is not limited to this example. Alternatively, one of the first and second load units 310 and 320 may transport a conveyed article 200 with a high frequency of use, and the other load unit may transport both a conveyed article 200 with a high frequency of use and a conveyed article 200 with a low frequency of use.

The first and second load units 310 and 320 may transport conveyed articles 200 by using different methods. For example, one of the first and second load units 310 and 320 may transport a conveyed article 200 with the use of pins, and the other load unit may transport a conveyed article 200 with the use of flanges. However, the present disclosure is not limited to this example. Alternatively, the first and second load units 310 and 320 may transport conveyed articles 200 by using the same method.

Referring again to FIG. 2, the driving unit 330 is provided to move the inter-floor transport apparatus 130 between the floors. To this end, the driving unit 330 may be provided with a motor, a wheel, and the like. For example, the driving unit 330 may be provided as a linear motor (LM) guide system including an LM.

Figure 6:
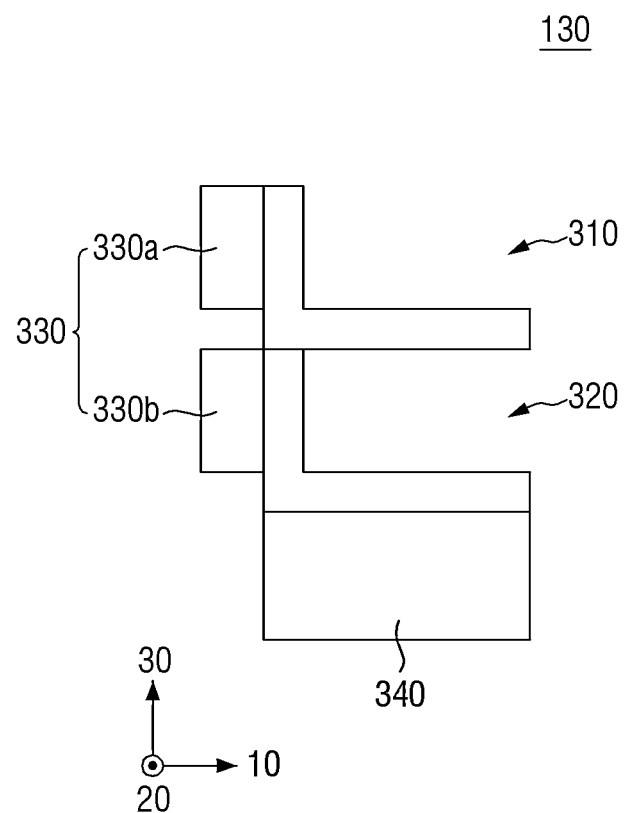
FIG. 6 is a diagram illustrating a third exemplary internal structure of the inter-floor transport apparatus of the logistics transport system.

A single driving unit 330 may be provided and may be integrally coupled to side surfaces of the first and second load units 310 and 320, but the present disclosure is not limited thereto. Alternatively, multiple driving units 330 may be provided and may be coupled separately to the side surfaces of the first and second load units 310 and 320. For example, referring to FIG. 6, a first driving unit 330a, which is coupled to the side surface of the first load unit 310, and a second driving unit 330b, which is coupled to the side surface of the second load unit 320, may be provided. FIG. 6 is a diagram illustrating a third exemplary internal structure of the inter-floor transport apparatus 130 of the logistics transport system 100.

The control unit 340 controls the operation of the driving unit 330. Although not specifically illustrated, in a case where the driving unit 330 is coupled separately to the first and second load units 310 and 320, the control unit 340, like the driving unit 330, may also be coupled separately to the first and second load units 310 and 320.

As already mentioned above, one of the first and second load units 310 and 320 may transport conveyed articles 200 of a particular type, and the other load unit may transport conveyed articles 200 of a variety of types including the particular type. Alternatively, one of the first and second load units 310 and 320 may transport conveyed articles 200 of the particular type, and the other load unit may transport conveyed articles of various types other than the particular type. The first load unit 310 will hereinafter be described as transporting conveyed articles 200 of the particular type, and the second load unit 320 will hereinafter be described as transporting conveyed articles 200 of various types including or excluding the particular type.

The moving speed of the inter-floor transport apparatus 130 may be variable depending on the size, volume, or weight of a conveyed article 200 mounted in the second load unit 320. In a case where the moving speed of the inter-floor transport apparatus 130 varies depending on the size of conveyed articles 200, the moving speed of the inter-floor transport apparatus 130 may be increased for conveyed articles 200 having a large size and may be reduced for conveyed articles 200 having a small size.

Also, in a case where the moving speed of the inter-floor transport apparatus 130 varies depending on the weight of conveyed articles 200, the moving speed of the inter-floor transport apparatus 130 may be reduced for conveyed articles 200 having a small weight and may be increased for conveyed articles 200 having a large weight. Also, in a case where the moving speed of the inter-floor transport apparatus 130 varies depending on the volume of conveyed articles 200, the moving speed of the inter-floor transport apparatus 130 may be increased for conveyed articles 200 having a large volume and may be reduced for conveyed articles 200 having a small volume.

Figure 7:
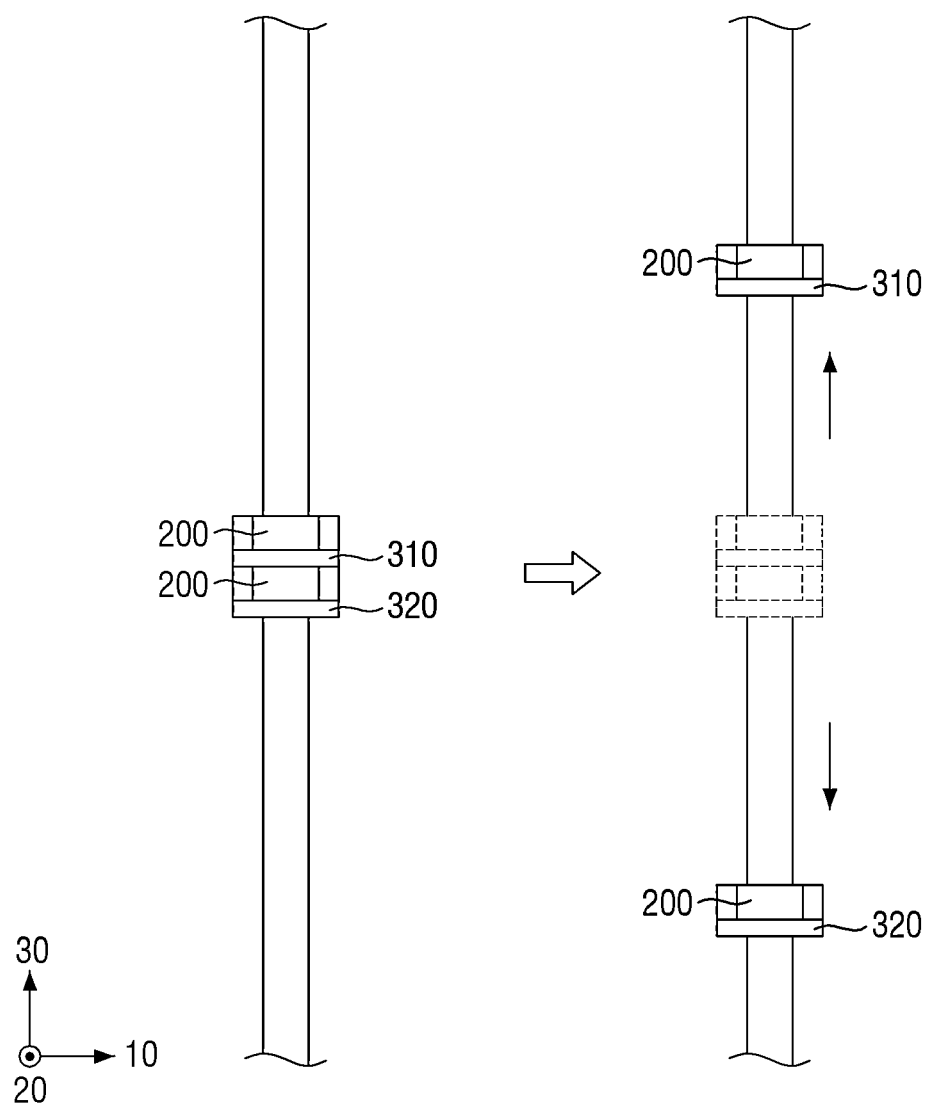
FIG. 7 is a diagram illustrating various operating principles of the inter-floor transport apparatus.

The first and second load units 310 and 320 may be driven separately, if necessary, and this will hereinafter be described. FIG. 7 is a diagram illustrating various operating principles of the inter-floor transport apparatus 100.

Referring to FIG. 7, it is assumed that the inter-floor transport apparatus 130 loads conveyed articles 200 in the first and second load units 310 and 320, from a k-th stage 110$k$, transports one of the conveyed articles 200 to a stage above the k-th stage 110$k$, and transports the other conveyed article 200 to a stage below the k-th stage 110$k$.

In this case, the inter-floor transport apparatus 130 needs to move to one of the stages above the k-th stage 110$k$ or the stage below the k-th stage 110$k$ and then to the other stage to transport all the conveyed articles 200 loaded in the first and second load units 310 and 320. Thus, the distance travelled by the inter-floor transport apparatus 130 and the amount of time that it takes to complete the transport of the conveyed articles 200 may both increase.

On the contrary, according to the embodiment of FIG. 7, the inter-floor transport apparatus 130 may be driven as follows.

First, a conveyed article 200 that needs to be transported to the stage above the k-th stage 110$k$ is loaded in the first load unit 310, and a conveyed article 200 that needs to be transported to the stage below the k-th stage 110$k$ is loaded in the second load unit 320.

Second, the first and second load units 310 and 320 are separated from each other, the first load unit 310 moves to the stage above the k-th stage 110$k$, and the second load unit 320 moves to the stage below the k-th stage 110$k$.

The inter-floor transport apparatus 130 and the logistics transport system 100, which includes the inter-floor transport apparatus 130, have been described with reference to FIGS. 1 through 9. The present disclosure relates to a tower lifter robot capable of transporting semiconductor containers having different sizes. The tower lifter robot may include a first transport loading device and a second transport loading device installed below the first transport loading device. The first transport loading device may transport large amounts of articles of a first type, and the second transport loading device may transport both articles of the first type and articles of a second type.

The second transport loading device, which is capable of loading articles of the first type and articles of the second type at the same time, may be positioned at a lower part of the tower lifter robot. Therefore, it is possible to configure a height that can directly interface with a user port on the first floor of an inter-floor facility, and articles of the second type can be delivered from the user port to a user without a requirement of a separate lifting unit.

Although embodiments of the present disclosure have been described in detail, those skilled in the art should understand that they may make various changes, substitutions and alterations herein without departing from the spirit and scope of the present disclosure. Accordingly, the foregoing should be considered as merely exemplary and not as limiting.

What is claimed is:

1. A logistics transport system comprising:
    a stage module installed in space where semiconductor devices are fabricated, the stage module including a plurality of stages, which are installed on different floors;
    a frame module installed to have a direction intersecting the plurality of stages as a length direction; and
    an inter-floor transport apparatus moving along the frame module and transporting conveyed articles to each of the stages,
    wherein the inter-floor transport apparatus includes a first load unit, which transports the conveyed articles, a second load unit, which is disposed directly below the first load unit and transports the conveyed articles, a driving unit, which moves the first and second load units, and a control unit, which controls an operation of the driving unit, and transports a plurality of conveyed articles at the same time,
    wherein the first load unit and the second load unit are configured to movable separately from each other in the length direction to selectively load one or more of the conveyed articles according to a destination of one or more of the conveyed articles.

2. The logistics transport system of claim 1, wherein
    the first load unit transports conveyed articles of a first type, and
    the second load unit transports conveyed articles of multiple types including the first type.

3. The logistics transport system of claim 1, wherein a moving speed of the inter-floor transport apparatus is variable depending on a size or weight of a conveyed article loaded in the second load unit.

4. The logistics transport system of claim 1, wherein the first and second load units transport conveyed articles that are classified by type.

5. The logistics transport system of claim 4, wherein
    the first load unit transports conveyed articles of a first type, and
    the second load unit transports conveyed articles of multiple types other than the first type.

6. The logistics transport system of claim 1, wherein the first and second load units transport conveyed articles that are classified by at least one of size, weight, and volume.

7. The logistics transport system of claim 1, wherein inner spaces of the first and second load units have different heights.

8. The logistics transport system of claim 1, wherein a height of the inner space of the second load unit is variable.

9. The logistics transport system of claim 8, wherein the height of the inner space of the second load unit is variable depending on a conveyed article loaded in the second load unit.

10. The logistics transport system of claim 1, wherein the first and second load units transport conveyed articles that are classified by frequency of use.

11. The logistics transport system of claim 1, wherein the first and second load units have different shapes.

12. The logistics transport system of claim 1, wherein the first load unit is formed as a structure with or without a top cover.

13. The logistics transport system of claim 1, wherein the first and second load units are separately driven if a destination of a conveyed article loaded in the first load unit is opposite to a destination of a conveyed article loaded in the second load unit.

14. The logistics transport system of claim 1, wherein the stage module is installed on each of the floors and includes stages, which include rails at their tops, transport units, which are installed on first sides of the stages near the frame module and transport the conveyed articles from the inter-floor transport apparatus onto the stages, and storage units, which are installed on second sides of the stages opposite to the first sides of the stages and store conveyed articles moving along the rails.

15. A logistics transport system comprising:
a stage module installed in space where semiconductor devices are fabricated, the stage module including a plurality of stages, which are installed on different floors;
a frame module installed to have a direction intersecting the plurality of stages as a length direction; and
an inter-floor transport apparatus moving along the frame module and transporting conveyed articles to each of the stages,
wherein
the stage module is installed on each of the floors and includes stages, which include rails at their tops, transport units, which are installed on first sides of the stages near the frame module and transport the conveyed articles from the inter-floor transport apparatus onto the stages, and storage units, which are installed on second sides of the stages opposite to the first sides of the stages and store conveyed articles moving along the rails,
the inter-floor transport apparatus includes a first load unit, which transports the conveyed articles, a second load unit, which is disposed directly below the first load unit and transports the conveyed articles, a driving unit, which moves the first and second load units, and a control unit, which controls an operation of the driving unit, and transports a plurality of conveyed articles at the same time,
the first load unit transports conveyed articles of a first type,
the second load unit transports conveyed articles of multiple types including the first type, and
a moving speed of the inter-floor transport apparatus is variable depending on a size or weight of a conveyed article loaded in the second load unit,
wherein the first load unit and the second load unit are configured to movable separately from each other in the length direction to selectively load one or more of the conveyed articles according to a destination of one or more of the conveyed articles.

16. An inter-floor transport apparatus for transporting conveyed articles between floors in space where semiconductor devices are fabricated, the inter-floor transport apparatus comprising:
a first load unit transporting the conveyed articles;
a second load unit disposed directly below the first load unit and transporting the conveyed articles;
a driving unit moving the first and second transport units; and
a control unit controlling an operation of the driving unit,
wherein the inter-floor transport apparatus transports a plurality of conveyed articles at the same time,
wherein the first load unit and the second load unit are configured to movable separately from each other in the length direction to selectively load one or more of the conveyed articles according to a destination of one or more of the conveyed articles.

17. The inter-floor transport apparatus of claim 16, wherein
the first load unit transports conveyed articles of a first type, and
the second load unit transports conveyed articles of multiple types including the first type.

18. The inter-floor transport apparatus of claim 16, wherein a moving speed of the inter-floor transport apparatus is variable depending on a size or weight of a conveyed article loaded in the second load unit.

19. The inter-floor transport apparatus of claim 16, wherein the first and second load units are separately driven if a destination of a conveyed article loaded in the first load unit is opposite to a destination of a conveyed article loaded in the second load unit.

* * * * *